US00RE43957E

(19) United States
(12) Reissued Patent
Nagai

(10) Patent Number: US RE43,957 E
(45) Date of Reissued Patent: Feb. 5, 2013

(54) HIGH-FREQUENCY MODULE INCLUDING CONNECTION TERMINALS ARRANGED AT A SMALL PITCH

(75) Inventor: Taturo Nagai, Kanazawa (JP)

(73) Assignee: Murata Manufacturing Co., Ltd., Kyoto (JP)

(21) Appl. No.: 13/157,527

(22) Filed: Jun. 10, 2011

Related U.S. Patent Documents

Reissue of:
(64) Patent No.: 7,609,130
Issued: Oct. 27, 2009
Appl. No.: 12/133,436
Filed: Jun. 5, 2008

U.S. Applications:
(63) Continuation of application No. PCT/JP2007/064118, filed on Jul. 17, 2007.

(30) Foreign Application Priority Data

Aug. 21, 2006 (JP) ..... 2006-224659

(51) Int. Cl.
*H01P 5/12* (2006.01)
*H01P 3/08* (2006.01)

(52) U.S. Cl. ..... 333/134; 333/5; 333/202; 333/246; 333/247

(58) Field of Classification Search ..... 333/126–129, 333/132, 134
See application file for complete search history.

(56) References Cited

U.S. PATENT DOCUMENTS

| | | | | |
|---|---|---|---|---|
| 5,783,976 | A * | 7/1998 | Furutani et al. | 333/134 |
| 6,774,748 | B1 * | 8/2004 | Ito et al. | 333/247 |
| 6,900,705 | B2 * | 5/2005 | Nakamura et al. | 333/25 |
| 7,245,884 | B2 * | 7/2007 | Oida et al. | 455/90.3 |
| 7,398,059 | B2 * | 7/2008 | Uejima et al. | 455/78 |
| 2002/0027019 | A1 | 3/2002 | Hashimoto | |
| 2004/0116098 | A1 | 6/2004 | Ochii et al. | |
| 2004/0119560 | A1 | 6/2004 | Tsurunari et al. | |
| 2007/0035362 | A1 | 2/2007 | Uejima et al. | |

FOREIGN PATENT DOCUMENTS

| | | | |
|---|---|---|---|
| EP | 1 300 946 | A2 | 4/2003 |
| EP | 1 557 944 | A1 | 7/2005 |
| JP | 05-335747 | A | 12/1993 |
| JP | 10-189194 | A | 7/1998 |
| JP | 2003-142981 | A | 5/2003 |
| JP | 2005-159080 | A | 6/2005 |
| JP | 2005-311929 | A | 11/2005 |

OTHER PUBLICATIONS

English translation of Official Communication issued in corresponding Japanese Patent Application No. 2007-558372, drafted on Jul. 7, 2010.
Official Communication issued in corresponding European Patent Application No. 07790880.4, mailed on Jan. 13, 2012.
Official Communication issued in International Patent Application No. PCT/JP2007/064118, mailed on Oct. 16, 2007.

* cited by examiner

*Primary Examiner* — Robert Pascal
*Assistant Examiner* — Kimberly Glenn
(74) *Attorney, Agent, or Firm* — Keating & Bennett, LLP

(57) ABSTRACT

In a high-frequency module, mounting lands arranged to mount at least one filter device having at least one set of an unbalanced terminal and two balanced terminals are provided at one side of a substrate top surface, and mounting lands arranged to mount at least one element electrically connected to the filter device are arranged at the opposite side. At least two of a plurality of connection terminals provided on a substrate bottom surface are respectively connected to conductor patterns connected to via-hole conductors penetrating the substrate within a mounting area for mounting the filter device via connection lines and are arranged at a pitch which is less than the pitch of the via-hole conductors.

3 Claims, 9 Drawing Sheets

FIG. 10
PRIOR ART
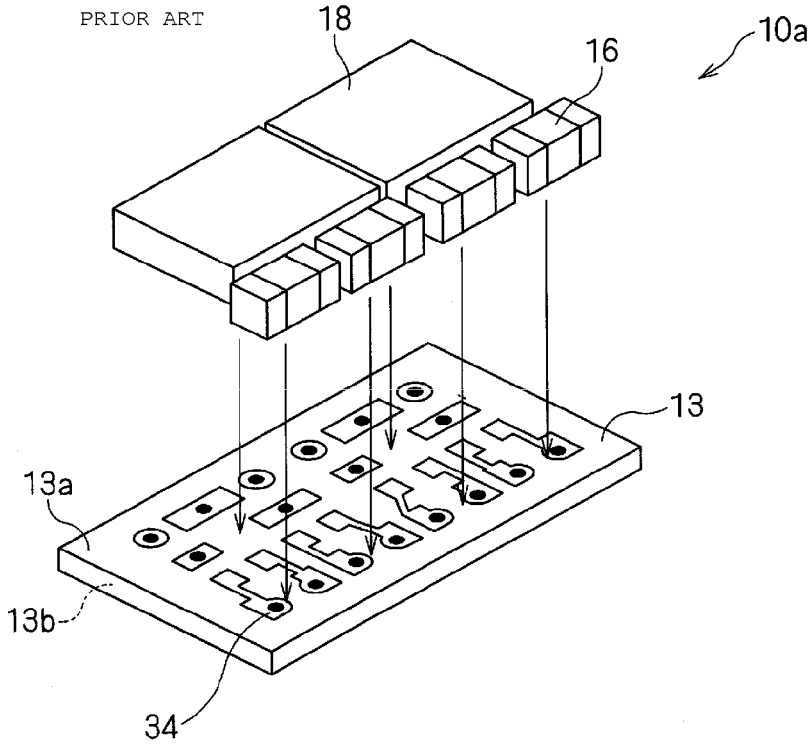
FIG. 11A
PRIOR ART
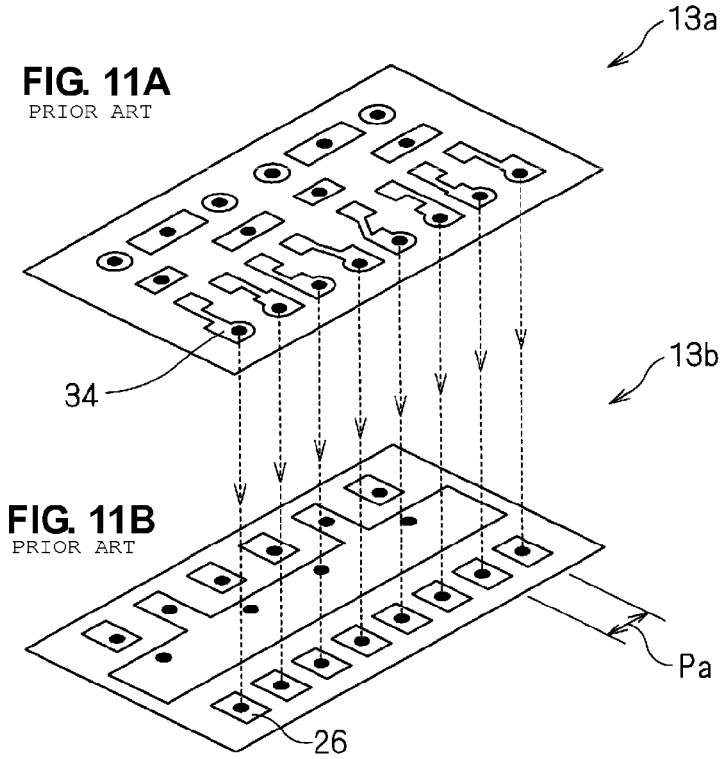
FIG. 11B
PRIOR ART

HIGH-FREQUENCY MODULE INCLUDING CONNECTION TERMINALS ARRANGED AT A SMALL PITCH

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to high-frequency modules, and particularly, to a high-frequency module including a surface acoustic wave device or a boundary wave device.

2. Description of the Related Art

Conventionally, high-frequency modules including a surface acoustic wave filter are used in mobile phones and other suitable devices.

For example, a high-frequency module 1, as illustrated in an electric circuit diagram in FIG. 16 and a perspective view in FIG. 17, includes an inductor 4 that is arranged across balanced output terminals 3a and 3b of a surface acoustic wave element 3 on a top surface of an insulating substrate 2, the surface acoustic wave element 3 and the inductor 4 are connected through connection lines 5 provided on the top surface of the insulating substrate 2, and a terminal of the inductor 4 and a connection terminal (not shown) are provided on the bottom surface of the insulating substrate 2 and connected by a via-hole conductor (not shown) in the insulating substrate 2 (See, for example, Japanese Unexamined Patent Application Publication No. 2003-142981).

When the configuration of the conventional art described above is used, for example, a high-frequency module 10a in which a plurality of surface acoustic wave filters 18 and inductors 16 are mounted on a top surface 13a of an insulating substrate 13 may be provided, as illustrated in a perspective view in FIG. 8, a cross-sectional view in FIG. 9, an exploded perspective view in FIG. 10, and a perspective view of insulating substrate top and bottom surfaces in FIGS. 11A and 11B.

In this case, as illustrated in FIG. 9 and FIGS. 11A and 11B, mounting lands 34 for mounting the inductors 16, and connection terminals 26 on a bottom surface 13b of the insulating substrate 13 are respectively connected to opposite ends of via-hole conductors 44. Thus, the pitch Pa of the mounting lands 34 for mounting the inductors 16 and the pitch of the connection terminals 26 on the bottom surface 13b of the insulating substrate 13 must be substantially equal.

Meanwhile, for high-frequency modules for mobile phones and other suitable devices, a reduced size and a decrease in the pitch of connection terminals are required.

To decrease only the pitch of connection terminals, as in a high-frequency module 10b illustrated in a perspective view in FIG. 12 and a perspective view in FIG. 13 of an insulating substrate bottom surface viewed from the top surface side, extension portions 37 extending from the mounting lands for mounting inductors are provided on a top surface 14a of an insulating substrate 14, and via-hole conductors are provided downward from the extension portions 37, so that a pitch Pb of connection terminals 28 on the bottom surface 14b of the insulating substrate 14 may be decreased. In this case, an extra space 14x for providing the extension portions 37 is required on the insulating substrate 14. This causes an increase in the dimensions of the product, and thus has adverse effects on the reduction in size of high-frequency modules.

To decrease the pitch of connection terminals while maintaining a reduced product size, as in a high-frequency module 10c illustrated in a perspective view in FIG. 14, a plan view in FIG. 15A of an insulating substrate top surface, and a perspective view in FIG. 15B of an insulating substrate bottom surface viewed from the top surface side, the size of elements 17 to be mounted on a top surface 15a of an insulating substrate 15 may be decreased. In this case, it is necessary to select the elements 17 having a size suitable for the pitch of connection terminals 27 on a bottom surface 15b of the insulating substrate 15. Thus, a pitch Pc of the connection terminals 27 is restricted by the size of the elements 17. In addition, there is a limitation in the manufacturing technique for decreasing a distance between via-hole conductors. Therefore, the pitch Pc of the connection terminals 27 can only be decreased to a certain extent.

SUMMARY OF THE INVENTION

To overcome the problems described above, preferred embodiments of the present invention provide a high-frequency module which enables the pitch of connection terminals to be freely decreased without an adverse effect on size reduction.

A high-frequency module according to a preferred embodiment of the present invention includes (a) a substrate in which a plurality of connection terminals arranged to be connected to another circuit [is] *are* provided on one main surface thereof, *and a plurality of mounting lands are provided on the other main surface thereof,* (b) at least one filter device having at least one set of an unbalanced terminal and two balanced terminals, which is mounted at one side of the other main surface of the substrate, and (c) at least one element electrically connected to the filter device, which is mounted at the opposite side to the filter device on the other main surface of the substrate. *The plurality of mounting lands includes at least two balanced mounting lands connected to the balanced terminals of the at least one filter device, and at least two element mounting lands connected to the at least one element. On the other main surface of the substrate, at least two connection wires are arranged so as to connect the at least two balanced mounting lands and the at least two element mounting lands, respectively. On the one main surface of the substrate, at least two connection lines are provided. In a mounting area of the substrate, via-hole conductors are provided so as to penetrate the substrate from the one main surface to the other main surface.* At least two of the plurality of connection terminals (hereinafter referred to as "specific connection terminals") are arranged on the one main surface of the substrate at the same side as the *at least one* element so as to be spaced from *the* via-hole conductors[penetrating the substrate from inside a mounting area for mounting the filter device on the other main surface of the substrate to the one main surface of the substrate], *and are connected to first ends of the at least two connection lines*. [At least two connection lines respectively electrically connecting the specific connection terminals and the via-hole conductors are provided on the one main surface of the substrate.] *First ends of via-hole conductors are connected to the at least two balanced mounting lands, and second ends of via-hole conductors are connected to second ends of the at least two connection lines.* The pitch of the specific connection terminals *connected to the at least two connection lines* is less than the pitch of the [via-hole conductors respectively]

*element mounting lands* electrically connected to the specific connection terminals via *the at least two connection wires, the at least two balanced mounting lands, the via-hole conductors, and* the *at least two* connection lines.

With the above-described configuration, by setting the pitch of the specific connection terminals to be less than the pitch of the via-hole conductors connected to the specific connection terminals via the connection lines, the pitch of the specific connection terminals can be decreased. Since the specific connection terminals can be designed without being restricted by the pitch of the via-hole conductors, the size of the high frequency module can be reduced.

Specifically, when via-hole conductors are provided below mounting lands of elements and connection terminals are provided near the ends of the via-hole conductors on the other side of the substrate, as in the conventional art, the pitch of the connection terminals is restricted by the pitch of the mounting lands of the elements. However, there is no such restriction in the above-described configuration.

Note that the filter device may be any type of filter device, such as a SAW filter utilizing a surface acoustic wave and a BAW filter utilizing a bulk wave.

Preferably, the filter device (1) includes at least two sets of the unbalanced terminal and the two balanced terminals and includes at least two sets of filters corresponding to at least two bands, and (2) is arranged on the other main surface of the substrate so that the balanced output terminals are adjacent to the elements.

In this case, the pitch of the connection terminals (specific connection terminals) connected to the balanced terminals of the filter device can be decreased.

Preferably, the elements are inductors connected in parallel across at least one set of the two balanced terminals of the filter device.

In this case, the characteristics of the filter device can be improved by the inductors. The pitch of the specific connection terminals can be set regardless of the size of the elements (inductors), which facilitates the selection of the elements.

According to preferred embodiments of the present invention, it is possible to freely decrease the pitch of the connection terminals without adversely effecting downsizing and without causing characteristic degradation.

Other features, elements, processes, steps, characteristics and advantages of the present invention will become more apparent from the following detailed description of preferred embodiments of the present invention with reference to the attached drawings.

BRIEF DESCRIPTION OF THE DRAWINGS

FIG. 10 is an exploded perspective view of the conventional surface acoustic wave device shown in FIG. 8.

FIG. 11A is a plan view of a substrate top surface, and FIG. 11B is a perspective view of a substrate bottom surface viewed from the substrate top surface side of the conventional surface acoustic wave device shown in FIG. 8.

DETAILED DESCRIPTION OF THE PREFERRED EMBODIMENTS

In the following, preferred embodiments of the present invention will be described with reference to FIGS. 1 to 7.

Figure 1:
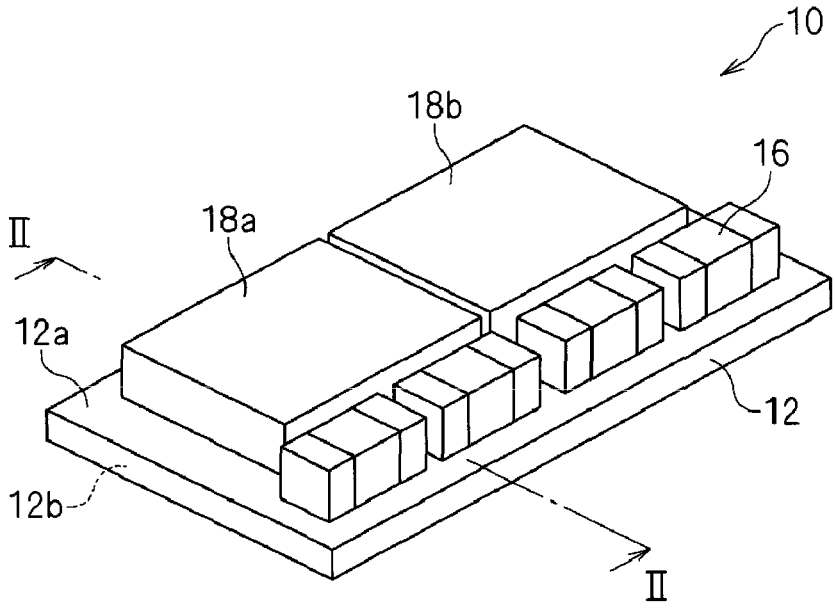
FIG. 1 is a perspective view of a surface acoustic wave device according to a preferred embodiment of the present invention.

As illustrated in a perspective view in FIG. 1, in a surface acoustic wave filter device 10, two SAW filter devices 18a and 18b and four inductors 16 are mounted on a top surface of a printed substrate 12.

The SAW filter devices 18a and 18b are balanced output type dual SAW filters in each of which two sets of SAW filters having one unbalanced input electrode and two balanced output electrodes are provided. The inductors 16 are matching elements arranged to provide matching between the individual SAW filters of the SAW filter devices 18a and 18b.

Figure 2:
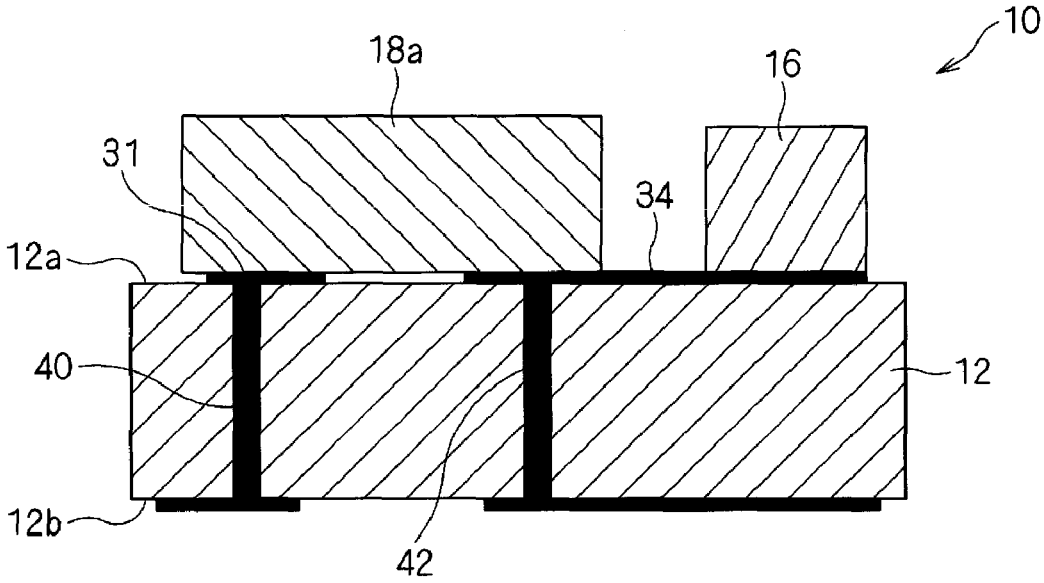
FIG. 2 is a cross-sectional view of the surface acoustic wave device shown in FIG. 1.

As illustrated in FIG. 2, which is a cross-sectional view taken along a line II-II in FIG. 1, via-hole conductors 40 and 42 extending from a top surface 12a to a bottom surface 12b are provided in the printed substrate 12. The via-hole conductors 40 and 42 are made of a conductive material.

Figure 3:
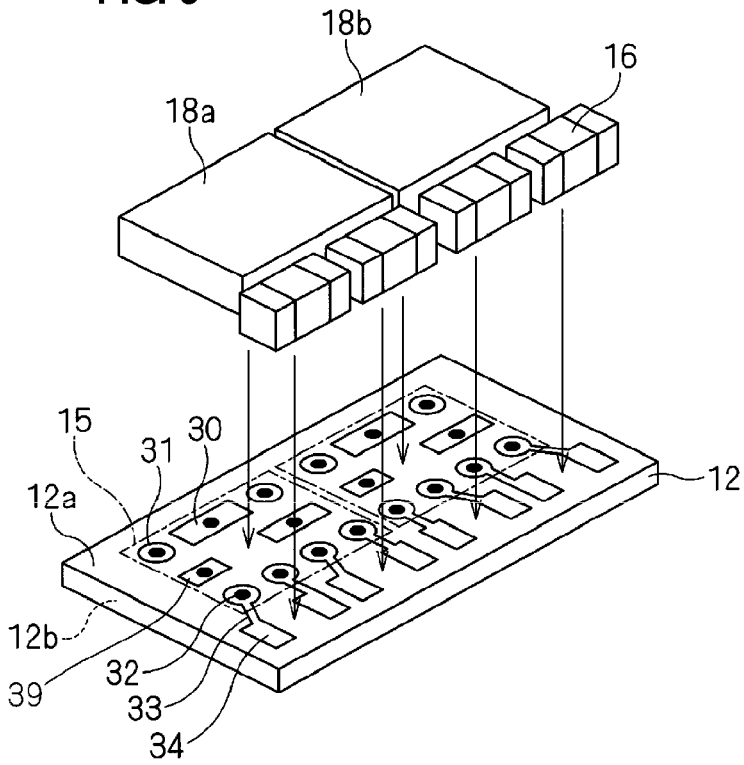
FIG. 3 is an exploded perspective view of the surface acoustic wave device shown in FIG. 1.
Figure 4:
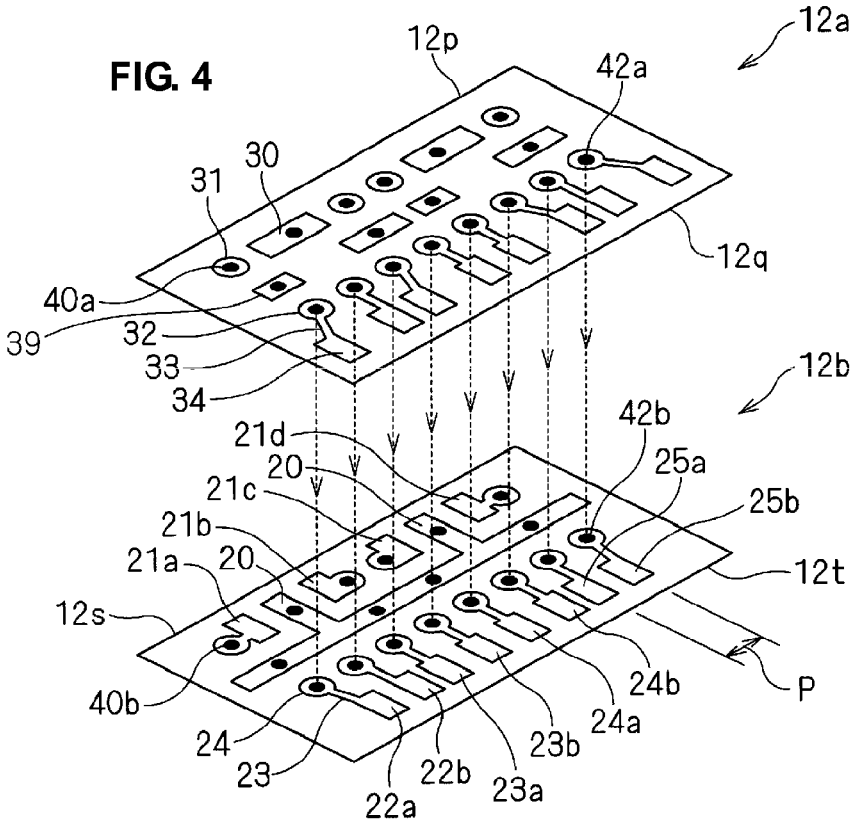
FIG. 4 is a plan view of a top surface of a substrate, and a perspective view of a bottom surface of the substrate viewed from the substrate top surface side of the surface acoustic wave device shown in FIG. 1.

As illustrated in an exploded perspective view in FIG. 3 and a plan view in FIG. 4 of the top surface 12a of the printed substrate 12, on the top surface 12a of the printed circuit substrate 12, mounting lands 30, 31, 32, and 39 arranged to be connected to external electrodes (not shown) of the SAW filter devices 18a and 18b are disposed in individual areas 15 for mounting the SAW filter devices 18a and 18b.

Specifically, in each of the areas 15, two mounting lands 31 respectively connected to the unbalanced signal input electrodes of the SAW filter devices 18a and 18b (hereinafter also referred to as "unbalanced mounting lands") are arranged at opposite sides of one of the mounting lands 30 connected to ground electrodes (not shown) of the SAW filter devices 18a and 18b, along one side 12p of a pair of opposing sides of the top surface 12a of the printed substrate 12. On the other side 12q of the pair of opposing sides of the top surface 12a of the printed substrate 12, four mounting lands 32 respectively connected to the balanced input electrodes of the SAW filter devices 18a and 18b (hereinafter referred to as "balanced mounting lands") are arranged. Two mounting lands 39 connected to other ground electrodes (not shown) of the SAW filter devices 18a and 18b are arranged between the mounting lands 30 and 31, and the mounting lands 32.

Eight mounting lands 34 respectively connected to electrodes of the four inductors 16 (hereinafter also referred to as inductor mounting lands) are arranged along the other side 12q of the pair of opposing sides of the top surface 12a of the printed substrate 12.

The eight inductor mounting lands 34 are respectively electrically connected to the eight balanced mounting lands 32 through connection lines 33. The eight inductor mounting lands 34 are arranged in a substantially straight line along the other side 12q of the pair of opposing sides of the top surface 12a of the printed substrate 12 and the eight mounting lands 32 are arranged in a substantially straight line along the other side 12q of the pair of opposing sides of the top surface 12a of the printed substrate 12.

As illustrated in a perspective view in FIG. 4 of the bottom surface 12b of the printed substrate 12 viewed from the side of the top surface 12a, on the bottom surface 12b of the printed substrate 12, four unbalanced signal input terminals 21a, 21b, 21c, and 21d defining connection terminals for connecting to another circuit and two ground terminals 20 are arranged along one side 12s of a pair of opposing sides of the bottom surface 12b of the printed substrate 12. In addition, four pairs of balanced signal output terminals 22a and 22b, 23a and 23b, 24a and 24b, and 25a and 25b defining connection terminals are arranged along the other side 12t of the pair of opposing sides of the bottom surface 12b of the printed substrate 12.

In FIGS. 3 and 4, black ellipses represent ends of via-hole conductors 40a and 40b, and 42a and 42b. As illustrated in FIG. 4, the balanced signal output terminals 22a and 22b, 23a and 23b, 24a and 24b, and 25a and 25b are respectively connected to one end of connection lines 23. The other end 24 of the connection lines 23 are respectively connected to the ends 42b of the via-hole conductors 42. The other ends 42a of the via-hole conductors 42a are connected to the balanced mounting lands 32.

The inductor mounting lands 34 and the balanced signal output terminals 22a and 22b, 23a and 23b, 24a and 24b, and 25a and 25b are connected via connection wires 33, the via-hole conductors 42, and the connection lines 23 and are not directly connected through the opposite ends of the via-hole conductors. Thus, the pitch P of the balanced signal output terminals 22a and 22b, 23a and 23b, 24a and 24b, and 25a and 25b can be set to be less than the pitch of the inductor mounting lands 34.

Figure 5:
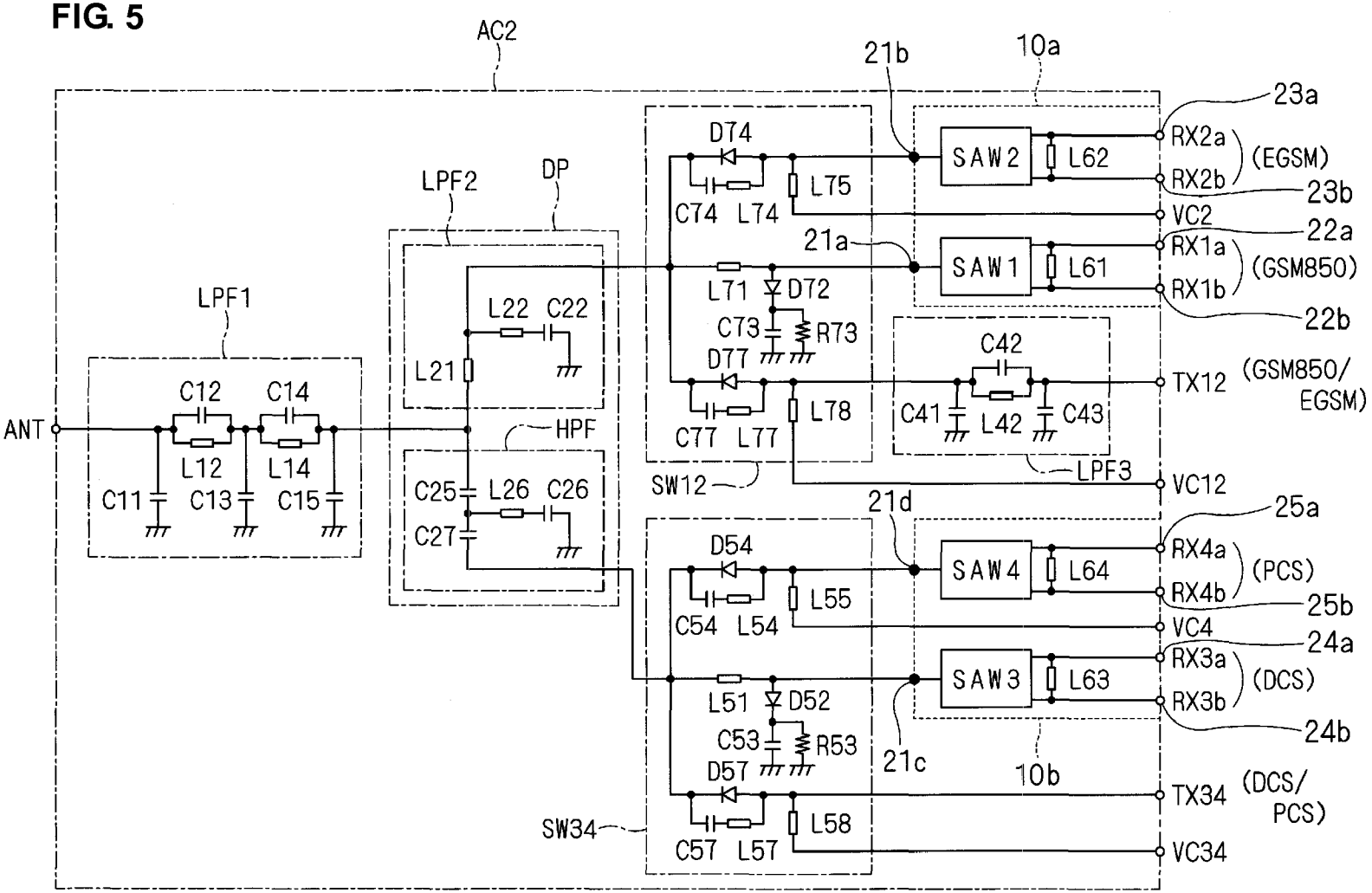
FIG. 5 is an electric circuit diagram of a high frequency module using the surface acoustic wave device shown in FIG. 1.

The surface acoustic wave device 10 is mounted on a substrate of an antenna circuit module and defines portions indicated by reference numerals 10a and 10b in an antenna circuit AC2 illustrated in FIG. 5. In the circuit diagram in FIG. 5, portions corresponding to the unbalanced signal input terminals 21a, 21b, 21c, and 21d and the balanced output terminals 22a and 22b, 23a and 23b, 24a and 24b, and 25a and 25b are denoted by the same reference numerals. The SAW filter device 18a is defined by SAW filter circuits SAW1 and SAW2, and the SAW filter device 18b is defined by SAW filter circuits SAW3 and SAW4. The inductors 16 are defined by coils L61, L62, L63, and L64.

In the antenna circuit AC2, a low-pass filter circuit LPF1 is provided in a signal path connecting an antenna terminal ANT and a diplexer circuit DP. In the diplexer circuit DP, a low-pass filter LPF 2 is provided in a signal path connecting to a switch circuit SW12, and a high-pass filter HPF is provided in a signal path connecting to a switch circuit SW34.

The switch circuit SW12 performs switching of signal paths for GSM850/EGSM systems.

The balanced SAW filter circuit SAW1 is connected in a signal path connecting the switch circuit SW12 to receiving terminals RX1a and RX1b. The coil L61 is connected across the receiving terminals RX1a and RX1b. This SAW filter circuit SAW1 passes signals in a reception frequency band of GSM850 standard (about 0.869 GHz to about 0.894 GHz) and attenuates signals at other frequencies.

The balanced SAW filter circuit SAW2 is connected in a signal path connecting the switch circuit SW12 to receiving terminals RX2a and RX2b. The coil L62 is connected across the receiving terminals RX2a and RX2b. This SAW filter circuit SAW2 passes signals in a reception frequency band of EGSM standard (about 0.925 GHz to about 0.960 GHz) and attenuates signals at other frequencies. A low-pass filter LPF3 is provided in a signal path connecting the switch circuit SW12 and a transmission terminal TX12.

The balanced SAW filter circuit SAW3 is connected in a signal path connecting the switch circuit SW34 to receiving terminals RX3a and RX3b. The coil L63 is connected across the receiving terminals RX3a and RX3b. This SAW filter circuit SAW3 passes signals in a reception frequency band of a DCS system (about 1.805 GHz to about 1.880 GHz) and attenuates signals at other frequencies.

The balanced SAW filter circuit SAW4 is connected in a signal path connecting the switch circuit SW34 to receiving terminals RX4a and RX4b. The coil L64 is connected across the receiving terminals RX4a and RX4b. This SAW filter circuit SAW4 passes signals in a reception frequency band of a PCS standard (about 1.930 GHz to about 1.990 GHz) and attenuates signals at other frequencies.

With this circuit configuration, the antenna switching AC2 performs switching of signal paths between one antenna portion and each of the four transmission/reception systems of GSM850, EGSM, DCS, and PCS systems.

The high-frequency module described above allows the pitch of the connection terminals to be freely decreased without adversely effecting downsizing.

Specifically, by connecting the lower ends of via-hole conductors provided on lower portions of the balanced output terminals of SAW filters and connection terminals through connection line, the pitch of terminals on a product bottom surface can be freely changed.

Since elements and connection terminals can be connected through a path in a space in which SAW filters and elements are arranged, downsizing of products can be achieved.

In addition, the element size can be selected without regard to the intervals of terminals on the bottom surface. This increases the degree of freedom in element selection, and the downsizing of elements permits downsizing of substrates and high-frequency modules.

At present, IC terminals with a pitch of about 0.50 mm have become the mainstream along with their downsizing. Thus, the pitch of about 0.50 mm is also required for balanced signal input terminals of a high-frequency module. By using the high-frequency module according to this preferred embodiment, balanced signal input terminals with a pitch of about 0.50 mm can be obtained even when an inductor having a size of about 1.0×about 0.5 mm with a good Q is used as the coil L61 in FIG. 5. On the other hand, to obtain balanced signal input terminals with the about 0.50 mm pitch in the conventional art, it is necessary to use an inductor having a size of about 0.6×about 0.3 with a bad Q as the coil L61 in FIG. 5.

Figure 6:
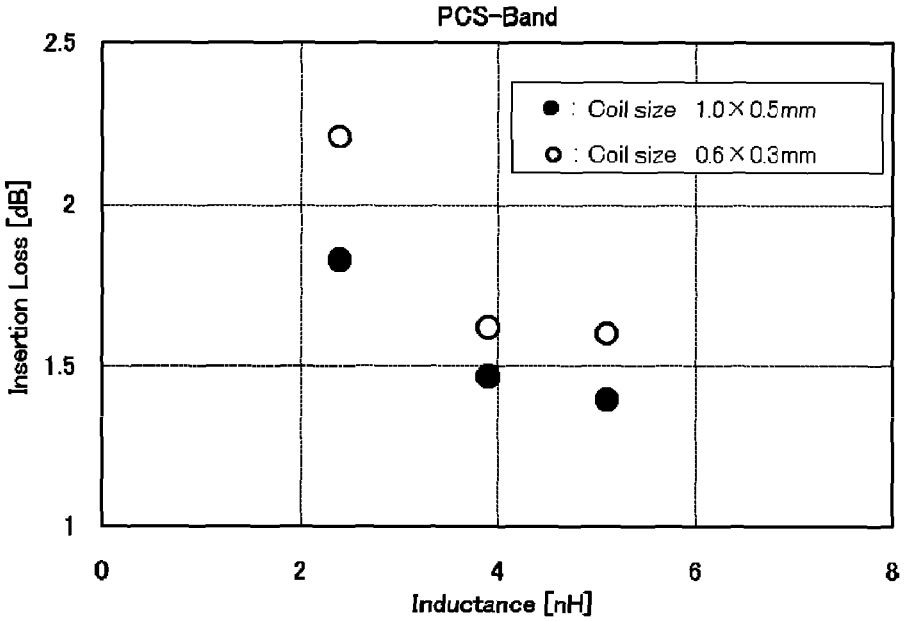
FIG. 6 is a graph of the insertion loss of an inductor.
Figure 7:
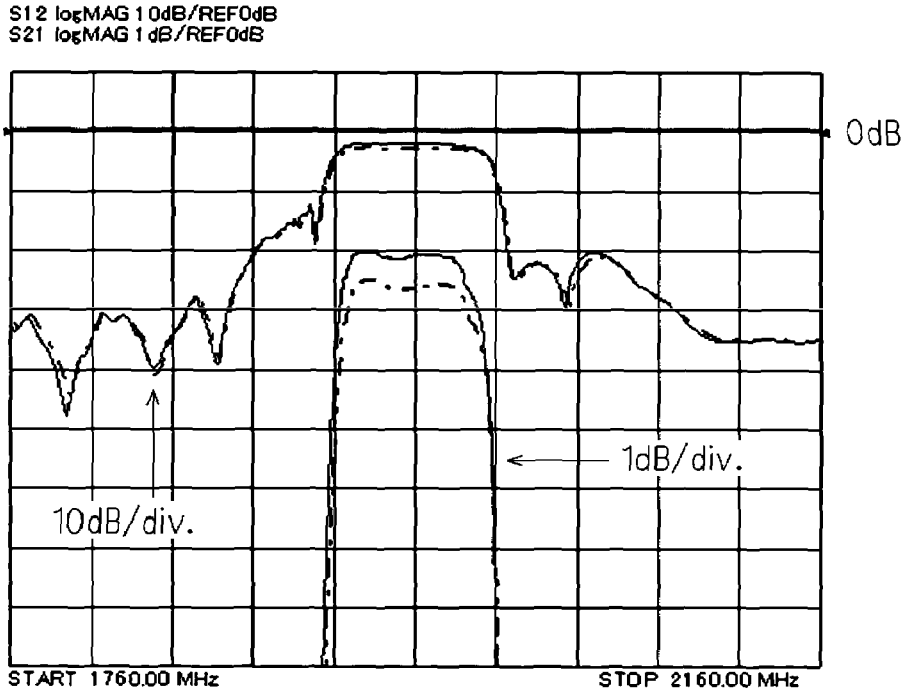
FIG. 7 is a graph of the output impedance of an inductor.
Figure 8:
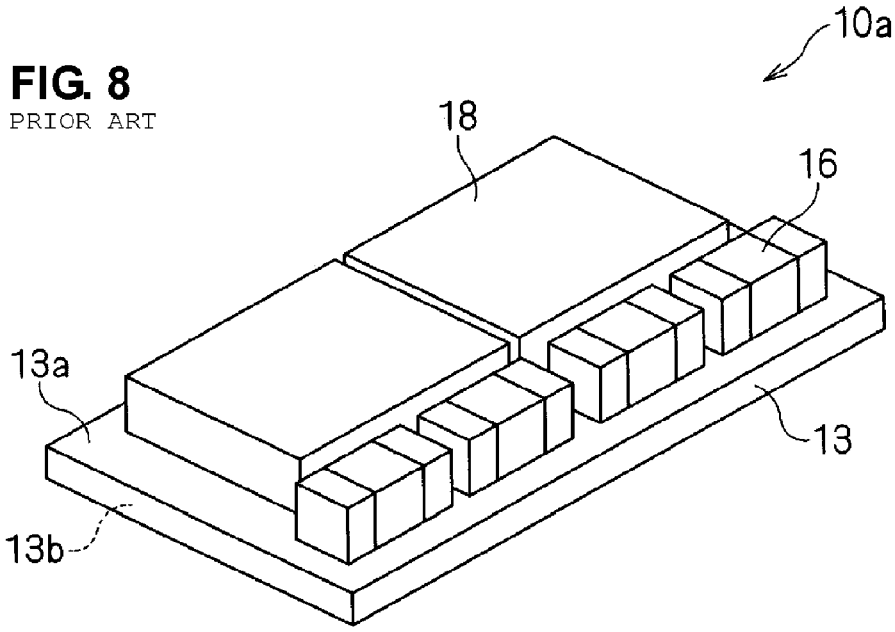
FIG. 8 PRIOR ART
FIG. 8 is a perspective view of a conventional surface acoustic wave device.
Figure 9:
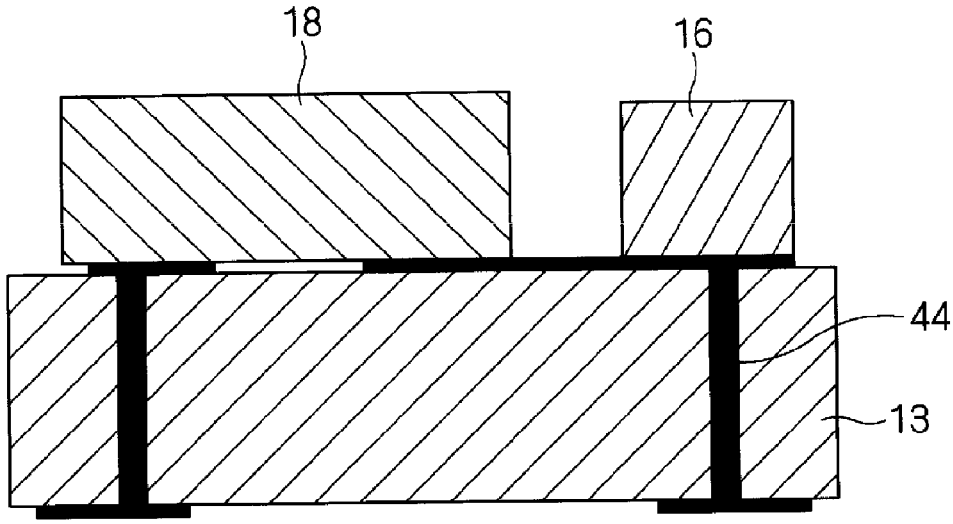
FIG. 9 PRIOR ART
FIG. 9 is a cross-sectional view of the conventional surface acoustic wave device shown in FIG. 8.
Figure 12:
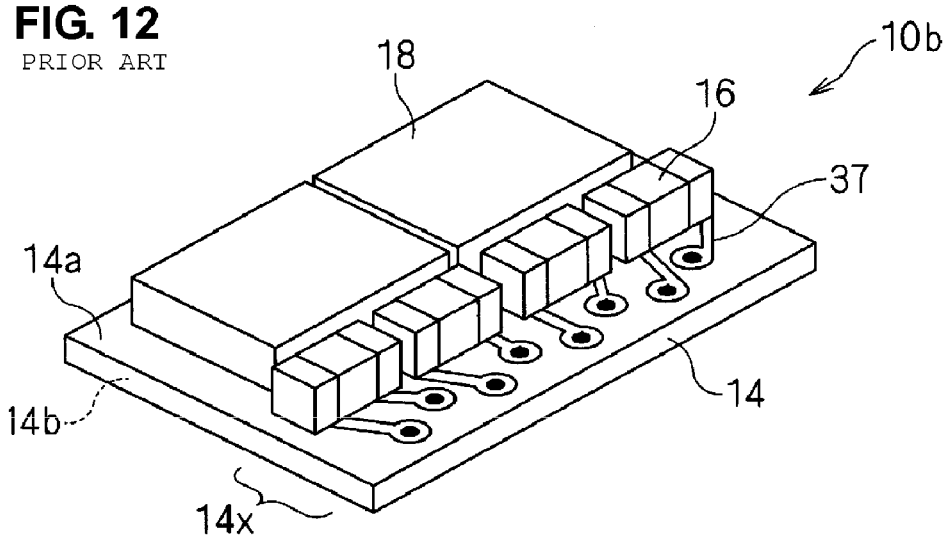
FIG. 12 PRIOR ART
FIG. 12 is a perspective view of a conventional surface acoustic wave device.
Figure 13:
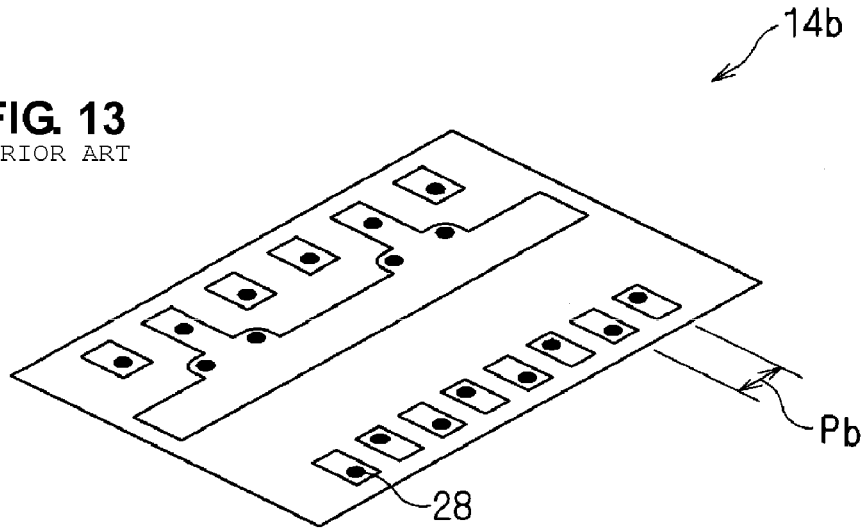
FIG. 13 PRIOR ART
FIG. 13 is a perspective view of a substrate bottom surface of the conventional surface acoustic wave device shown in FIG. 12.
Figure 14:
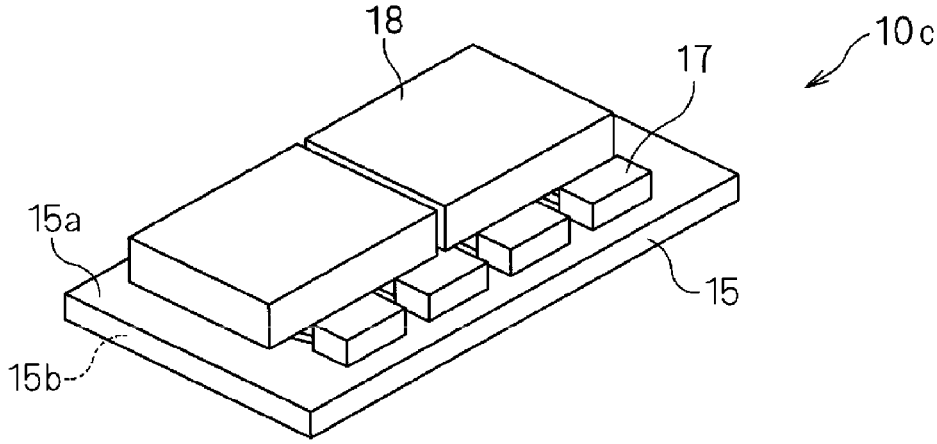
FIG. 14 PRIOR ART
FIG. 14 is a perspective view of a conventional surface acoustic wave device.
Figure 15A:
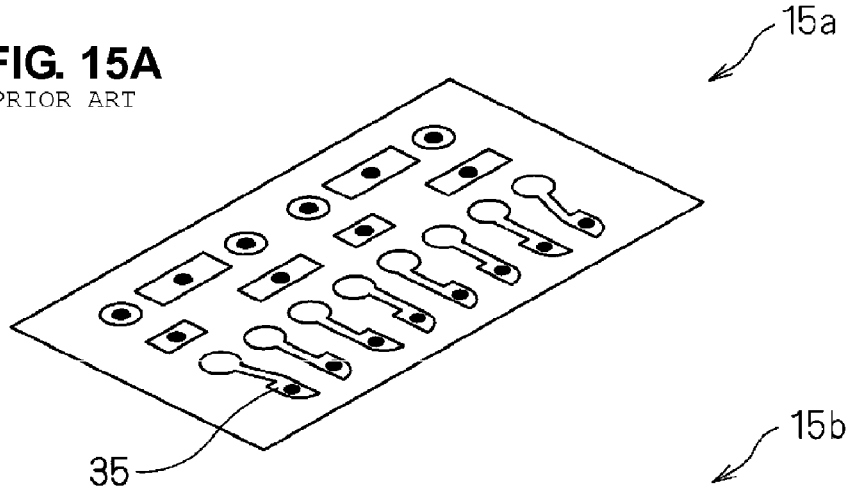
FIG. 15A PRIOR ART
FIG. 15A is a plan view of a substrate top surface.
Figure 15B:
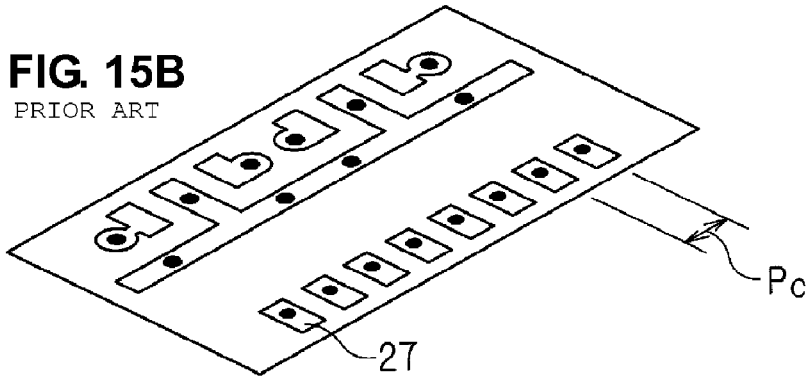
FIG. 15B PRIOR ART
FIG. 15B is a perspective view of a substrate bottom surface viewed from the substrate top surface side of the conventional surface acoustic wave device shown in FIG. 14.
Figure 16:
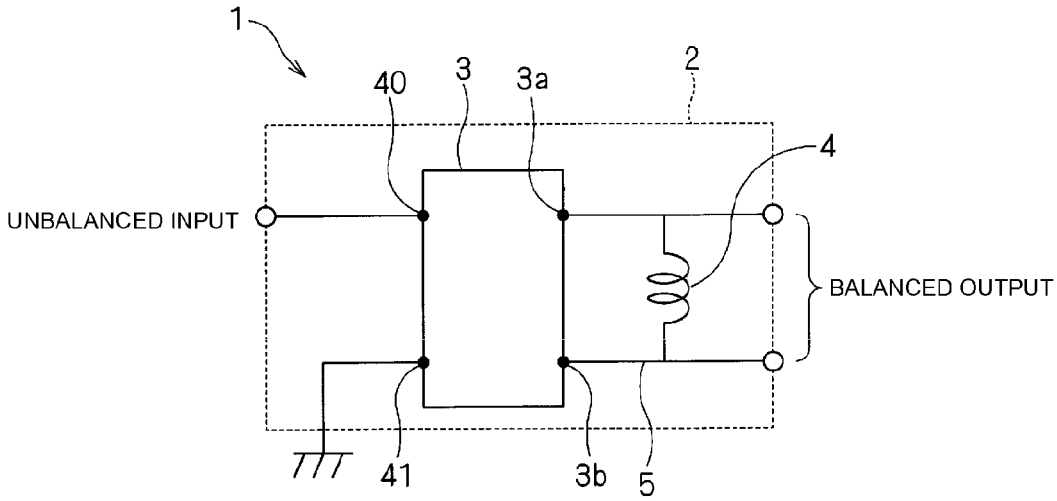
FIG. 16 PRIOR ART
FIG. 16 is an electric circuit diagram of a conventional surface acoustic wave device.
Figure 17:
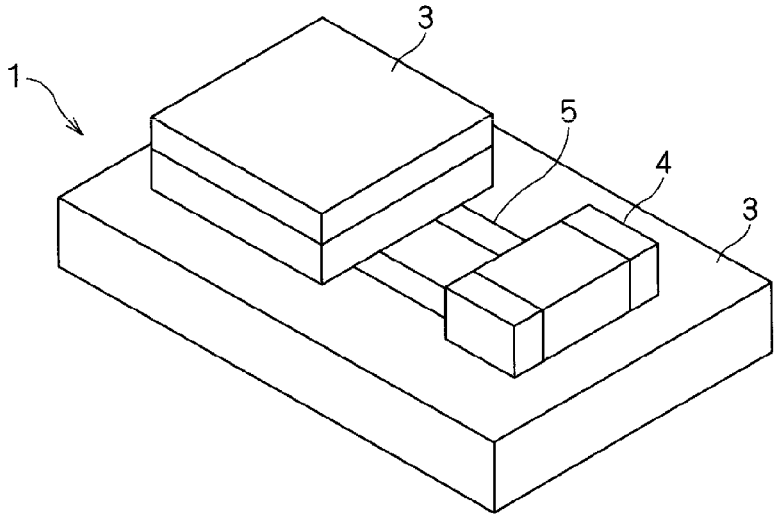
FIG. 17 PRIOR ART
FIG. 17 is a perspective view of a conventional surface acoustic wave device.

FIG. 7 illustrates output impedances of the balanced signal output terminals 22a and 22b of the SAW filter circuit SAW1 obtained when an inductor of about 1.0 mm×about 0.5 mm size with a good Q and an inductor of about 0.6 mm×about 0.3 size with a bad Q were used. The solid line represents the output impedance obtained when the inductor of about 1.0 mm×about 0.5 mm size was used, and the chain line represents the output impedance obtained when the inductor of about 0.6 mm×about 0.3 mm size was used. FIG. 6 is a graph comparing the insertion loss of the inductor of about 1.0 mm×about 0.5 mm size and the insertion loss of the inductor of about 0.6 mm×about 0.3 mm size.

It can be seen from FIG. 7 that the pass band characteristic is degraded to a lesser extent when the inductor of about 1.0 mm×about 0.5 mm size with a good Q is used as the coil L61 according to an example of preferred embodiments of the present invention.

Note that the present invention is not limited to the preferred embodiments described above, and may include various modifications.

For example, the filter device to be mounted on a substrate is not limited to a SAW (surface acoustic wave) device, and instead may be a BAW (bulk wave) device. In addition, an element other than an inductor may be connected to the filter device.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A high-frequency module comprising:

a substrate [having] *including* a first main surface and a second main surface, [and including] a plurality of connection terminals arranged to be connected to another circuit and provided on the first main surface of the substrate*, and a plurality of mounting lands provided on the second main surface*;

at least one filter device mounted at a first side of the second main surface of the substrate, the at least one filter device including at least one set of an unbalanced terminal and two balanced terminals; and at least one element mounted at a second side opposite to the first side of the second main surface of the substrate, the *at least one* element being electrically connected to the at least one filter device; wherein

*the plurality of mounting lands includes at least two balanced mounting lands connected to the balanced terminals of the at least one filter device and at least two element mounting lands connected to the at least one element;*

*at least two connection wires are provided on the second main surface of the substrate, respectively connecting the at least two balanced mounting lands and the at least two element mounting lands;*

*at least two connection lines are provided on the first main surface;*

*via-hole conductors are provided in a mounting area of the substrate to mount the at least one filter device so as to penetrate the substrate from the second main surface to the first main surface;* at least two of the plurality of connection terminals define specific connection terminals[and], *which* are arranged on the first main surface of the substrate at the second side[,] so as to be spaced from *the* via-hole conductors[penetrating the substrate from inside a mounting area for mounting the at least one filter device on the second main surface of the substrate to the first main surface of the substrate], *and which are connected to first ends of the at least two connection lines*;

[at least two connection lines respectively electrically connecting the specific connection terminals and the via-hole conductors are provided on the first main surface of the substrate; and] *first ends of the via-hole conductors are respectively connected to the at least two balanced mounting lands, and second ends of the via-hole conductors are respectively connected to second ends of the at least two connection lines; and* a pitch of the specific connection terminals *connected to the first ends of the at least two connection lines* is less than a pitch of [the via-hole conductors respectively electrically] *the at least two element mounting lands* connected to the specific connection terminals via *the at least two connection wires, the at least two balanced mounting lands, the via-hole conductors, and* the *at least two* connection lines.

2. The high-frequency module according to claim 1, wherein the at least one filter device includes at least two sets of the unbalanced terminal and the two balanced terminals and at least two sets of filters corresponding to at least two bands, and the *two* balanced terminals are arranged on the second main surface of the substrate, so as to be adjacent to the at least one element.

3. The high-frequency module according to claim 1, wherein the at least one element is an inductor connected in parallel across [at least one set of] the two balanced terminals of the *at least one* filter device.

* * * * *